US010741250B1

(12) United States Patent
Chang et al.

(10) Patent No.: US 10,741,250 B1
(45) Date of Patent: Aug. 11, 2020

(54) NON-VOLATILE MEMORY DEVICE AND DRIVING METHOD THEREOF

(71) Applicant: MACRONIX INTERNATIONAL CO., LTD., Hsinchu (TW)

(72) Inventors: Hsing-Wen Chang, Miaoli County (TW); Yao-Wen Chang, Zhubei (TW); Chi-Yuan Chin, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/431,913

(22) Filed: Jun. 5, 2019

(51) Int. Cl.
*G11C 16/08* (2006.01)
*G11C 16/10* (2006.01)
*H01L 27/11582* (2017.01)
*G11C 16/34* (2006.01)
*G11C 16/04* (2006.01)

(52) U.S. Cl.
CPC ............. *G11C 16/08* (2013.01); *G11C 16/10* (2013.01); *G11C 16/0483* (2013.01); *G11C 16/3427* (2013.01); *H01L 27/11582* (2013.01)

(58) Field of Classification Search
CPC ..... G11C 16/08; G11C 16/10; G11C 16/3427; G11C 16/0483; H01L 27/11582
See application file for complete search history.

(56) References Cited

U.S. PATENT DOCUMENTS

| 9,330,766 | B1 | 5/2016 | Jung et al. | |
|---|---|---|---|---|
| 9,607,711 | B1 | 3/2017 | Lee | |
| 2010/0067305 | A1 | 3/2010 | Park et al. | |
| 2010/0157684 | A1 | 6/2010 | Kim | |
| 2013/0117620 | A1* | 5/2013 | Joo | G11C 16/3418 714/746 |
| 2019/0108889 | A1* | 4/2019 | Gholamipour | G11C 16/349 |
| 2019/0180824 | A1* | 6/2019 | Hsu | G11C 29/021 |

* cited by examiner

*Primary Examiner* — Gene N Auduong
(74) *Attorney, Agent, or Firm* — McClure, Qualey & Rodack, LLP (57) ABSTRACT

A non-volatile memory device driving method, applicable to a non-volatile memory device comprising a row decoder and a memory array, comprises: utilizing the row decoder to transmit multiple word line signals to multiple word lines of the memory array; according to an address, utilizing the row decoder to switch a selected word line signal of the multiple word line signals from a predetermined voltage level to a program voltage level; utilizing the row decoder to switch at least one support word line signal of the multiple word line signals from the predetermined voltage level to a first pass voltage level; when the selected word line signal is remained at the program voltage level, utilizing the row decoder to switch the at least one support word line signal from the first pass voltage level to a higher second pass voltage level.

20 Claims, 13 Drawing Sheets

NON-VOLATILE MEMORY DEVICE AND DRIVING METHOD THEREOF

BACKGROUND

Field of Invention

The present disclosure relates to a non-volatile memory device and driving method thereof. More particularly, the present disclosure relates to 3D NAND flash memory device and driving method thereof.

Description of Related Art

In the situation that the process technology of the 2D flash memory approaches to the limit to miniaturization, the 3D flash memory gradually receives attention from the industries in order to efficiently increase the capacity per unit area of the flash memory. The flash memory technologies include NAND flash memory and NOR flash memory, where the NAND flash memory has been widely used because of the fast programming and erasing speed thereof. In the 3D NAND flash memory, multiple word lines are arranged in parallel with tight spacing, and each word line is configured to control thousands of memory cells. Thus, each of the word lines has large transmittance impedance, and a long programming time is required for the conventional driving method of the 3D NAND flash memory, so that a target word line is ensured to be completely charged to the predetermined program voltage level. However, a longer programming time results in a more serious program disturb in the 3D NAND flash memory.

SUMMARY

The disclosure provides a non-volatile memory device driving method, applicable to a non-volatile memory device comprising a row decoder and a 3D memory array, comprising the following operations: utilizing the row decoder to transmit a plurality of word line signals to a plurality of word lines of the 3D memory array; according to an address, utilizing the row decoder to switch a selected word line signal of the plurality of word line signals from a predetermined voltage level to a program voltage level, wherein the selected word line signal is transmitted via a selected word line of the plurality of word lines to program a memory cell coupled with the selected word line; utilizing the row decoder to switch at least one support word line signal of the plurality of word line signals from the predetermined voltage level to a first pass voltage level, wherein the at least one support word line signal is transmitted via at least one support word line of the plurality of word lines, and the at least one support word line is different from the selected word line; when the selected word line signal is remained at the program voltage level, utilizing the row decoder to switch the at least one support word line signal from the first pass voltage level to a second pass voltage level, wherein the second pass voltage level is higher than the first pass voltage level.

The disclosure provides a non-volatile memory device comprising a 3D memory array and a row decoder. The 3D memory array comprises a plurality of word lines. The row decoder is configured to receive an address, and to transmit a plurality of word line signals to the plurality of word lines. The row decoder is further configured to switch a selected word line signal of the plurality of word line signals from a predetermined voltage level to a program voltage level according to the address, and to switch at least one support word line signal of the plurality of word line signals from the predetermined voltage level to a first pass voltage level. The selected word line signal is transmitted via a selected word line of the plurality of word lines to program a memory cell coupled with the selected word line, the at least one support word line signal is transmitted via at least one support word line of the plurality of word lines, and the at least one support word line is different from the selected word line. When the selected word line signal is remained at the program voltage level, the row decoder switches the at least one support word line signal from the first pass voltage level to a second pass voltage level, and the second pass voltage level is higher than the first pass voltage level.

It is to be understood that both the foregoing general description and the following detailed description are by examples, and are intended to provide further explanation of the disclosure as claimed.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Figure 1:
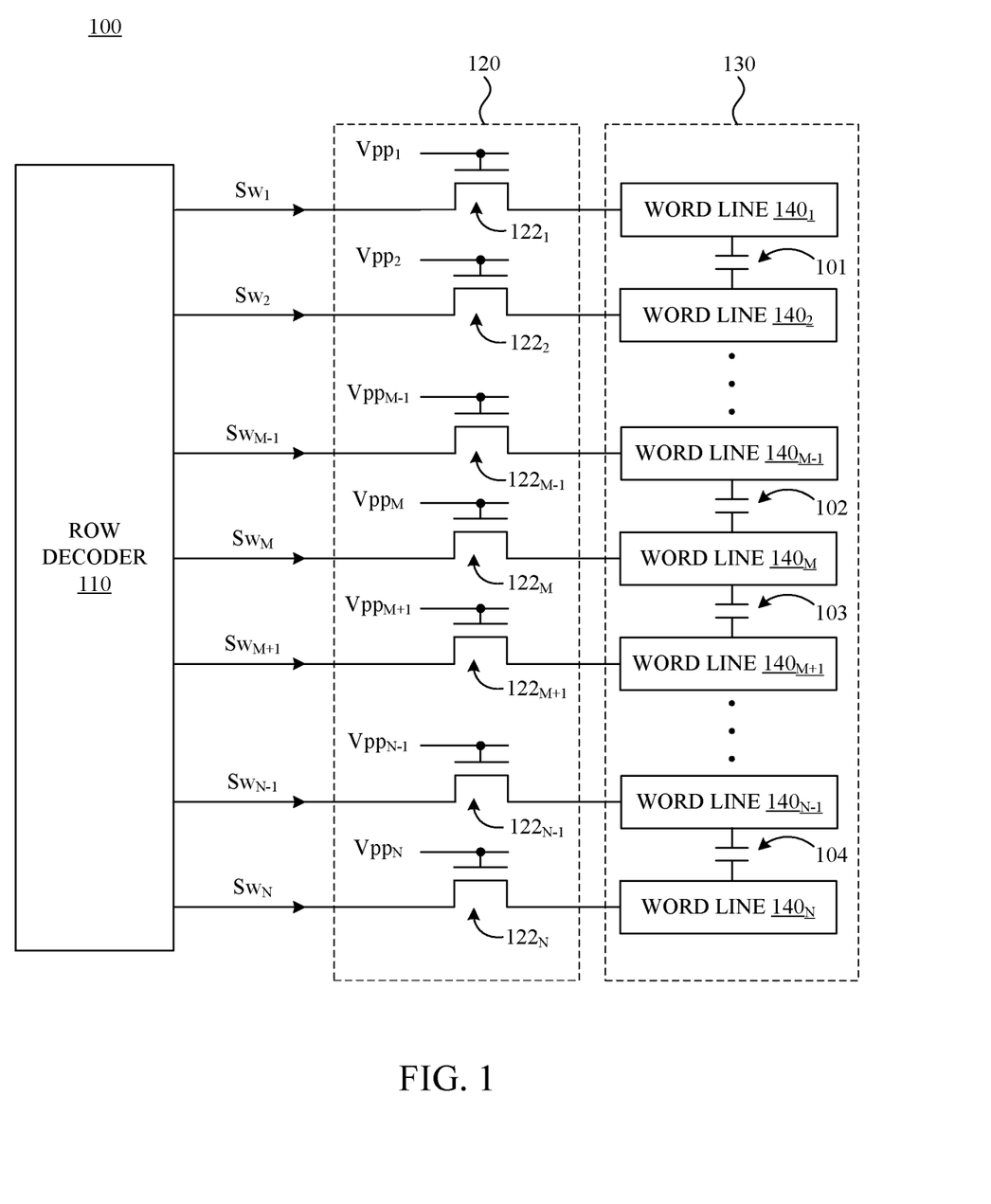
FIG. 1 is a simplified functional diagram of a non-volatile memory device according to one embodiment of the present disclosure.

FIG. 1 is a simplified functional diagram of a non-volatile memory device 100 according to one embodiment of the present disclosure. Thte non-volatile memory device 100 comprises a row decoder 110, a word line driver 120, and a memory array 130, where the memory array 130 comprises a plurality of word lines $140_1$-$140_N$. The row decoder 110 is configured to correspondingly provide a plurality of word line signals $Sw_1$-$Sw_N$ to the word lines $140_1$-$140_N$, so as to conduct the operations of read, erase, program, erase verify, and program verify toward the memory array 130, where the memory array 130 may be realized as a two-dimentional (2D) memory array or a three-dimentional (3D) memory array. The word line driver 120 comprises a plurality of switches $122_1$-$122_N$. The switches $122_1$-$122_N$ are correspondingly coupled between the word lines $140_1$-$140_N$ and the row decoder 110, and are switched on/off according to the switching signals Vpp1-VppN. In practice, the switches $122_1$-$122_N$ can be realized by the N or P-type transistors of any suitable category, such as the MOS field-effect transistor. For the purpose of explanatory convenience in the following description, the memory cells, bit lines, string select lines, and ground select lines of the memory array 130 are not shown in FIG. 1.

As shown in FIG. 1, parasitic capacitor elements may exist between the word lines $140_1$-$140_N$. For example, capacitor elements 101-104 are coupled respectively between the word lines $140_1$ and $140_2$, the word lines $140_{M-1}$ and $140_M$, the word lines $140_M$ and $140_{M+1}$, and the word lines $140_{N-1}$ and $140_N$. When the row decoder 110 supplies operating voltages to the corresponding one or more of the word lines $140_1$-$140_N$, the parasitic capacitor elements coupled with the word lines $140_1$-$140_N$ would cause the transfer delay or the signal distortion of the word line signals $Sw_1$-$Sw_N$. Notably, the capacitor elements 101-104 are merely used to illustrate the transfer delay on the word lines $140_1$-$140_N$, are not real capacitors in the memory array 130.

Figure 2:
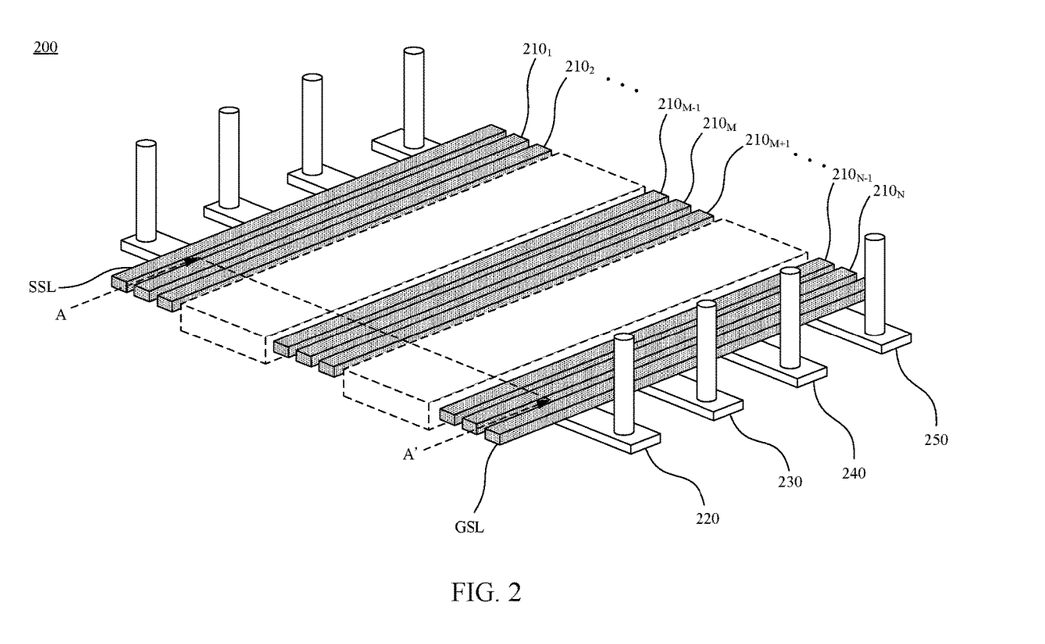
FIG. 2 is a simplified schematic diagram of a 2D memory array according to one embodiment of the present disclosure.

FIG. 2 is a simplified schematic diagram of a 2D memory array 200 according to one embodiment of the present disclosure. The 2D memory array 200 may be used to implement the memory array 130 of FIG. 1, and comprises a string select line SSL, a ground select line GSL, a plurality of word lines $210_1$-$210_N$, and a plurality of bit lines 220, 230, 240, and 250, where the word lines $210_1$-$210_N$ may be used to implement the word lines $140_1$-$140_N$ of FIG. 1. Each of the word lines $210_1$-$210_N$ comprises a plurality of memory cells coupled in series connection. These memory cells are located at the cross points of the word lines $210_1$-$210_N$ and the bit lines 220-250, and the overlapping parts of the word lines $210_1$-$210_N$ and the bit lines 220-250 define the control gates of the memory cells. For drawing simplicity, only four bit lines are shown in FIG. 2, but this disclosure is not limited thereto. The 2D memory array 200 of FIG. 2 may comprise, however, numerous bit lines to achieve high storage density.

Figure 3:
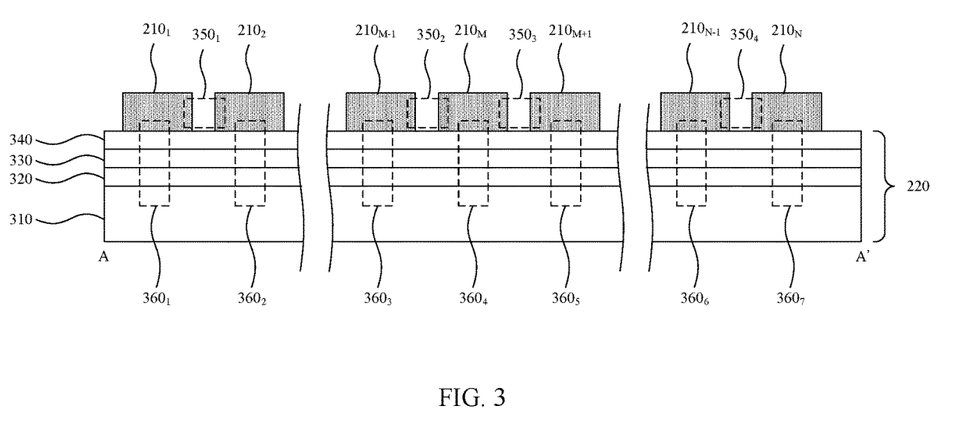
FIG. 3 is a schematic cross-sectional view along the section line AA' of FIG. 2.

FIG. 3 is a schematic cross-sectional view along the section line AA' of FIG. 2. The bit line 220 (or any one of the bit lines 230-250) comprises a semiconductor layer 310, and further comprises a multilayer dielectric charge trapping structure comprising at least of a first silicon dioxide layer 320, a silicon nitride layer 330, and a second silicon dioxide layer 340. Parasitic capacitor elements may exist between the word lines $210_1$-$210_N$. For example, areas $350_1$-$350_4$ correspond to the possible existence positions of the capacitor elements 101-104 of FIG. 1, respectively. In addition, a plurality of parasitic capacitor elements may also exist between the word lines $210_1$-$210_N$ and the semiconductor layer 310, where these parasitic capacitor elements are coupled in the parallel connection through the semiconductor layer 310. For example, areas $360_1$-$360_7$ correspond to the possible existence positions of these parallel connected parasitic capacitor elements.

Figure 4:
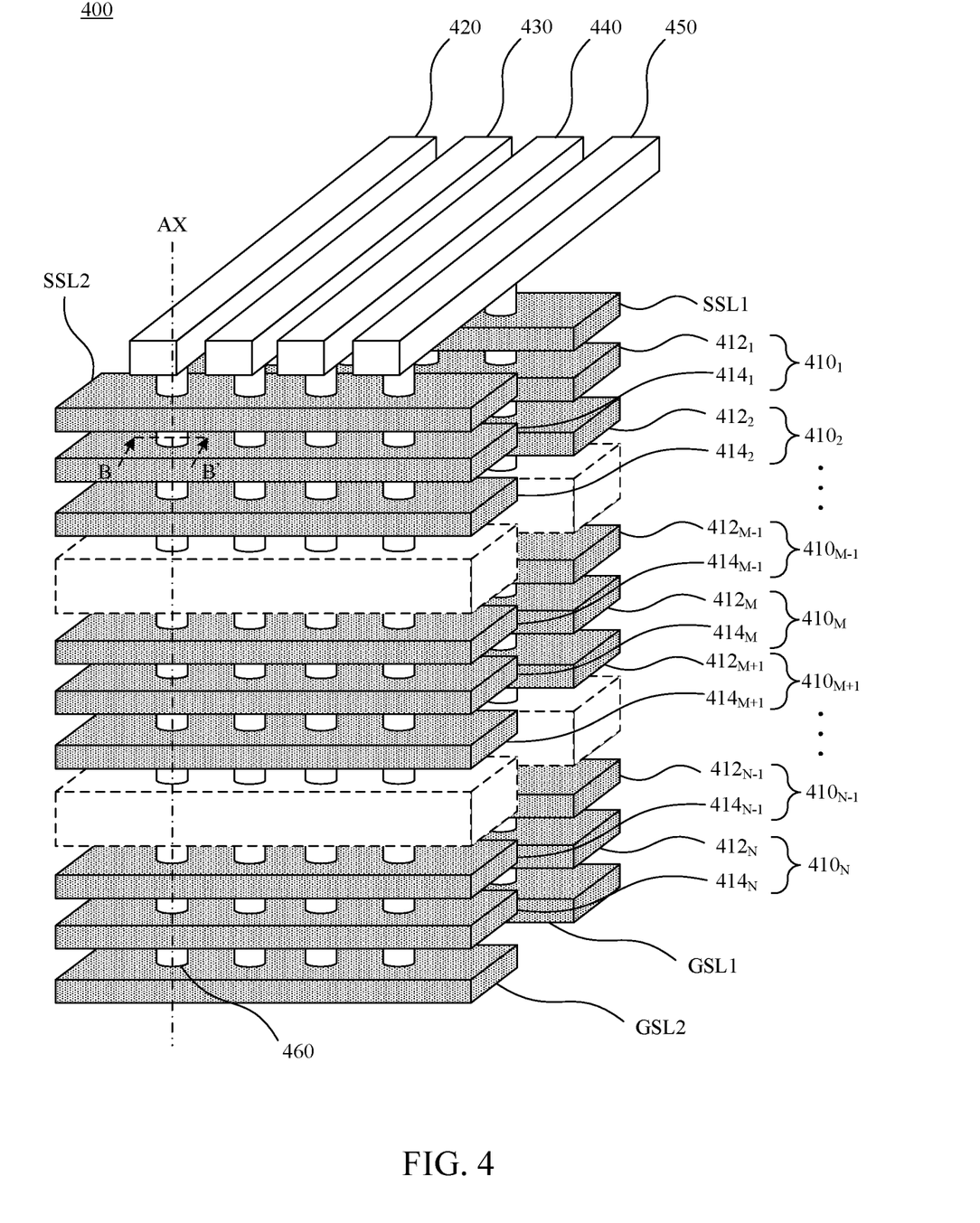
FIG. 4 is a simplified schematic diagram of a 3D memory array according to one embodiment of the present disclosure.

FIG. 4 is a simplified schematic diagram of a 3D memory array 400 according to one embodiment of the present disclosure. The 3D memory array 400 may be used to implement the memory array 130 of FIG. 1, and comprises a first string select line SSL1, a second string select line SSL2, a furst ground select line GSL1, a second ground select line GSL2, a plurality of word lines $410_1$-$410_N$, a plurality of bit lines 420, 430, 440, and 450, and a plurality of cylinders 460. The word lines $410_1$-$410_N$ may be used to implement the word lines $140_1$-$140_N$ if FIG. 1, and each of the word lines $410_1$-$410_N$ comprises a plurality of extension portions mutually coupled and extending in parallel. For example, the word line $410_1$ comprises a first extension portion $412_1$ and a second extension portion $414_1$; the word line $410_2$ comprises a first extension portion $412_2$ and a second extension portion $414_2$; the word line $410_N$ comprises a first extension portion $412_N$ and a second extension portion $414_N$, and so forth. Each of the cylinders 460 extends through the first extension portions $412_1$-$412_N$ or the second extension portions $414_1$-$414_N$, and comprises a plurality of memory cells. These memory cells are located at the cross points of the cylinders 460 and the first extension portions $412_1$-$412_N$, and located at the cross points of the cylinders 460 and the second extension portions $414_1$-$414_N$. The overlapping parts of the word lines $410_1$-$410_N$ and the cylinders 460 define the control gates of the memory cells. Each of the bit lines 420-450 are correspondingly coupled with a column of cylinders 460. For drawing simplicity, only four bit lines and two extension portions are shown in FIG. 4, but this disclosure is not limited thereto. The 3D memory array 400 of FIG. 4 may comprise numerous bit lines, and each of the word lines $410_1$-$410_N$ may comprise numerous extension portions, so as to achieve high storage density, where the number of the string select lines is corresponding to the number of extension portions of each of the word lines $410_1$-$410_N$. In addition, the axis AX is the symmetry axis of axial symmetry of the cylinder 460.

Figure 5:
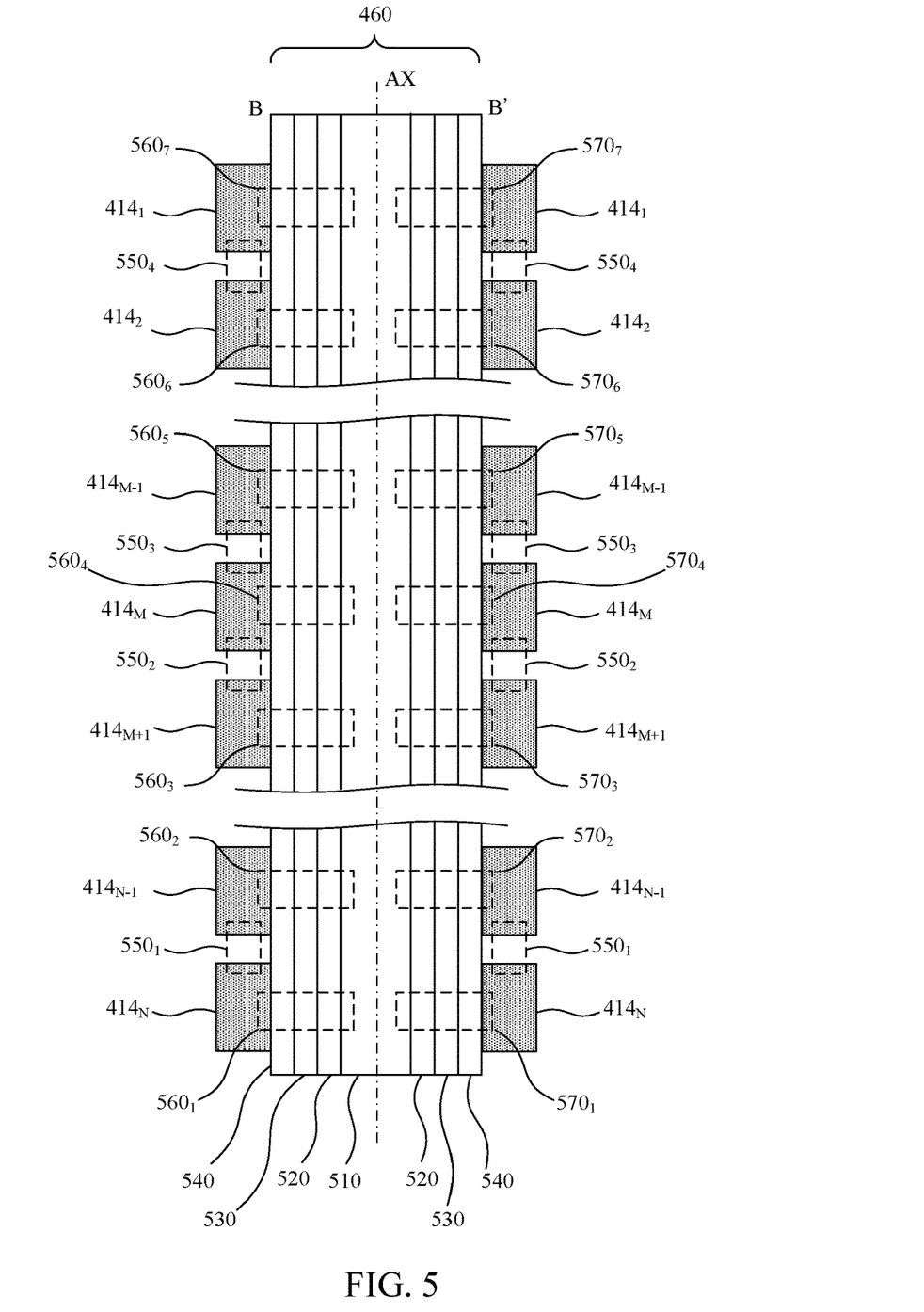
FIG. 5 is a schematic cross-sectional view along the section line BB' of FIG. 4.

FIG. 5 is a schematic cross-sectional view along the section line BB' of FIG. 4. The cylinder 460 comprises a semiconductor layer 510, and further comprises a multilayer dielectric charge trapping structure comprising at least of a first silicon oxide layer 520, a silicon nitride layer 530, and a second silicon oxide layer 540. The semiconductor layer 510, the first silicon oxide layer 520, the silicon nitride layer 530, and the second silicon oxide layer 540 is axisymmetric in respect to the axis AX. The first silicon oxide layer 520, silicon nitride layer 530, and the second silicon oxide layer 540 covers the cylindrical semiconductor layer 510. Parasitic capacitor elements exist between the word lines $410_1$-$410_N$. For example, areas $550_1$-$550_4$ between the word lines are corresponding to the possible existence locations of the capacitor elements 101-104 of FIG. 1, respectively. In addition, parasitic capacitor elements may also exist between the word lines $410_1$-$410_N$ and the semiconductor layer 510, where these parasitic capacitor elements are coupled in the parallel connection through the semiconductor layer 510. For example, areas $560_1$-$560_7$ and areas $570_1$-$570_7$ are corresponding to the possible existence locations of the parallel coupled parasitic capacitor elements. In other words, the complex structure of the 3D memory array 400 may cause numerous parasitic capacitor elements located on the word lines $410_1$-$410_N$, which in turn may reduce the program speed of the 3D memory array 400.

Figure 6:
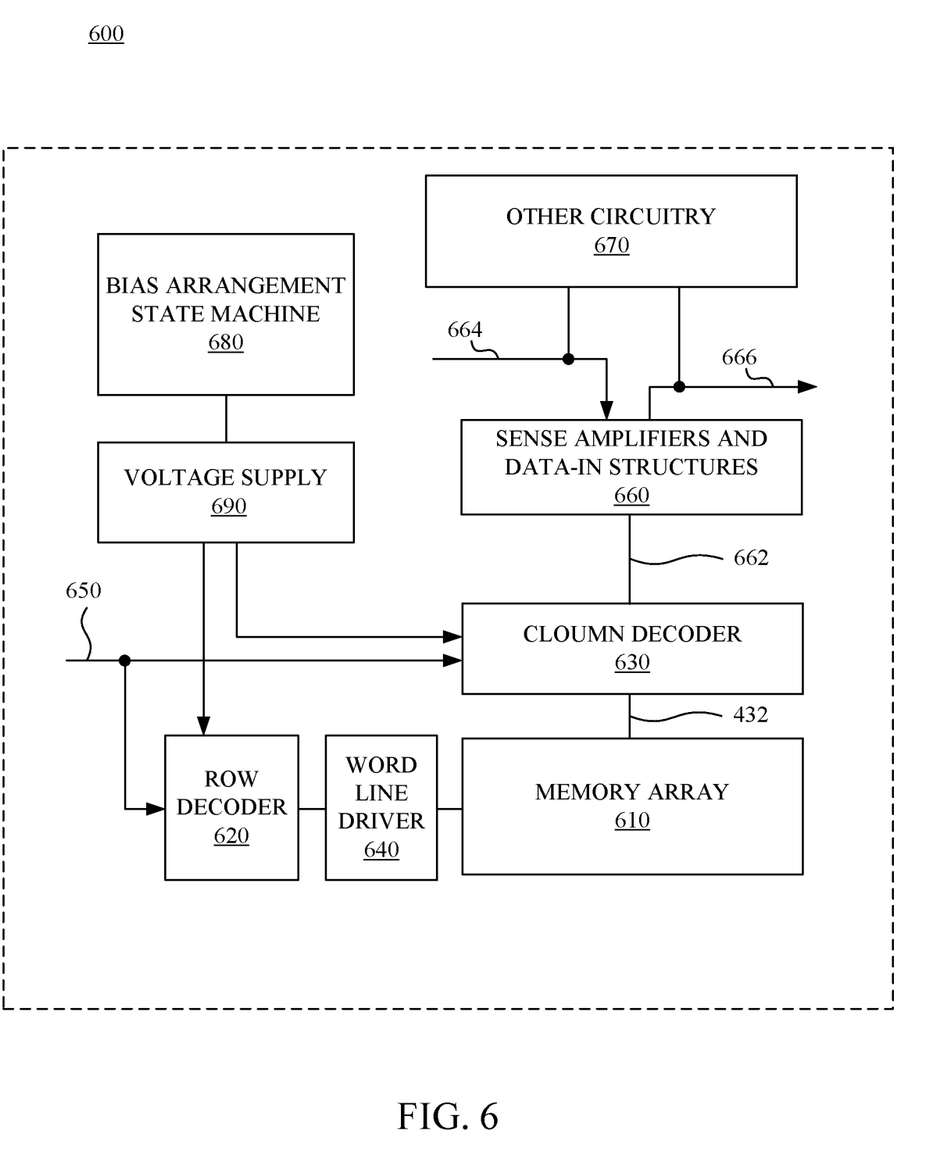
FIG. 6 is a simplified functional diagram of a non-volatile memory device according to another embodiment of the present disclosure.

FIG. 6 is a simplified functional diagram of a non-volatile memory device 600 according to one embodiment of the present disclosure. The non-volatile memory device 600 comprises a memory array 610, a row decoder 620, a column decoder 630, a word line driver 640, and a bus 650. The memory array 610 may be implemented by the memory array 130 of FIG. 1, the 2D memory array 200 of FIG. 2, or the 3D memory array 400 of FIG. 4. The row decoder 620 may be implemented by the row decoder 110 of FIG. 1. The word line driver 640 may be implemented by the word line driver 120 of FIG. 1. The row decoder 620 is coupled with a plurality of word lines of the memory array 610 through the word line driver 640. The column decoder 630 is coupled with the memory array 610 through a plurality of bit lines 432. The row decoder 620 and column decoder 430 receive the address via the bus 450, and configured to program the memory array 410 or read data from the memory array 410 according to the address.

The non-volatile memory device 600 further comprises sense amplifiers and data-in structures 660. The sense amplifiers and data-in structures coupled with the column decoder 630 through the bus 662. The sense amplifiers and data-in structures 660 receives data, which is from the input/output port of the non-volatile memory device 600 or from other data sources internal or external to the non-volatile memory device 600, via the data-in line 664. Data supplied by the sense amplifiers and data-in structures 660 is transmitted to the input/output port of the non-volatile memory device 600 or to other destination address internal or external to the non-volatile memory device 600 via the data-out line 666.

The non-volatile memory device 600 further comprises other circuitry 670. The other circuitry 670 may be realized with the general purpose processor or the special purpose application circuit, or be realized with combination of modules providing system-on-a-chip functionality and supported by the non-volatile memory device 600.

The non-volatile memory device 600 further comprises a bias arrangement state machine 680 and a voltage supply 690. The bias arrangement state machine 680 is configured to control the voltage supplied by the voltage supply 690, so as to generated the required voltages such as read, erase, program, erase verify and program verify voltages. In practice, the bias arrangement state machine 480 can be realized with the special purpose logic circuitry, the general purpose processor, or a combination of the special purpose logic circuitry and the general purpose processor.

Figure 7:
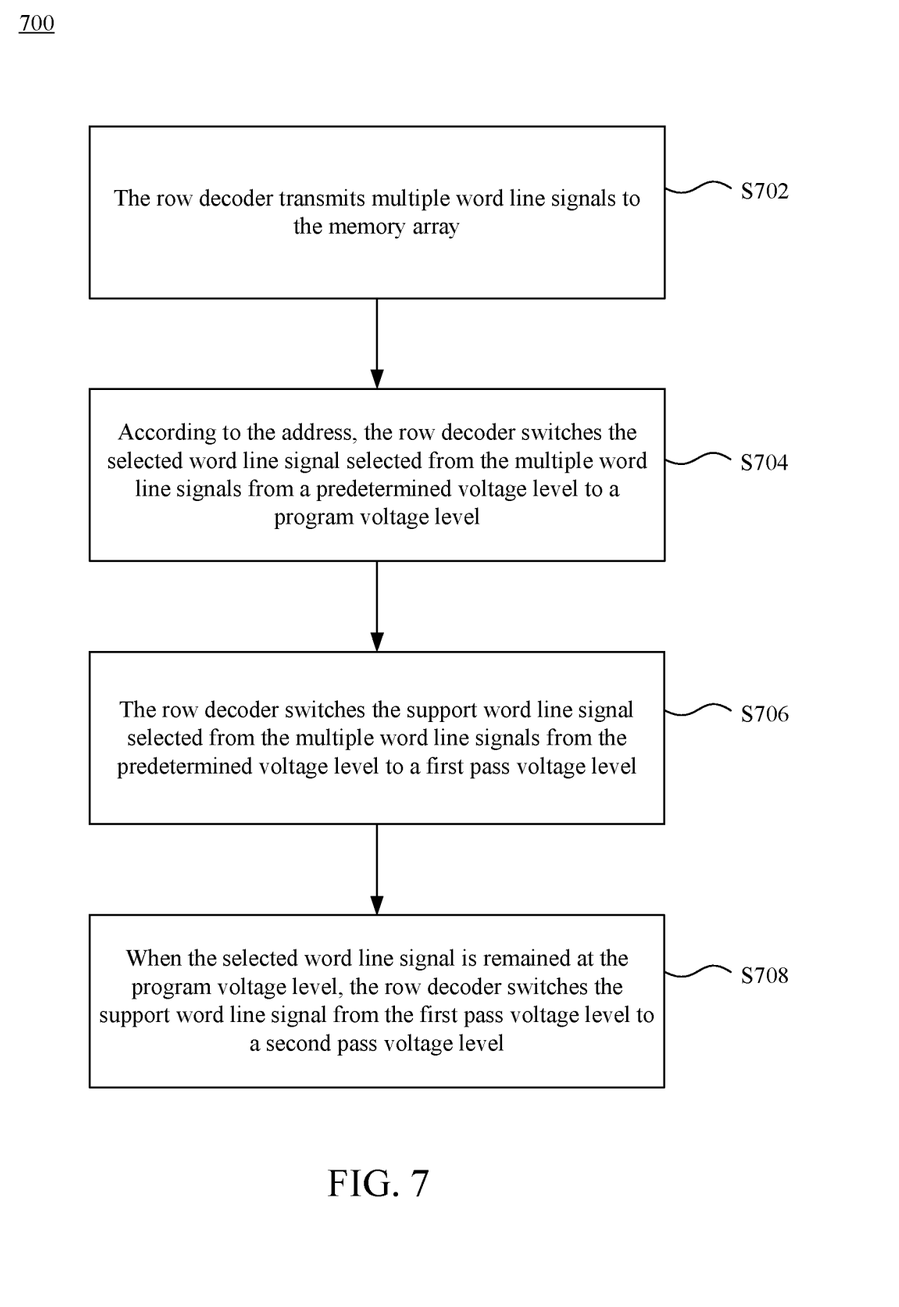
FIG. 7 is a simplified flowchart of a non-volatile memory device driving method according to one embodiment of the present disclosure.

FIG. 7 is a simplified flowchart of a non-volatile memory device driving method 700 according to one embodiment of the present disclosure. The non-volatile memory device driving method 700 is applicable to the non-volatile memory devices 100 and 600, and comprises operations S702-S708. The non-volatile memory device driving method 700 can prevent the programming speed of the non-volatile memory device 400 to be affected by the parasitic capacitor elements on the word lines. For the purpose of explanatory convenience in the following description, reference will be made to FIGS. 1 and 7.

In operation S702, the row decoder 110 correspondingly transmits the word line signals $Sw_1$-$Sw_N$ to the word lines $140_1$-$140_N$ of the memory array 130. Then, the row decoder 110 conducts operation S704 to program a memory cell coupled with one of the word lines $140_1$-$140_N$ according to the received address.

Figure 8:
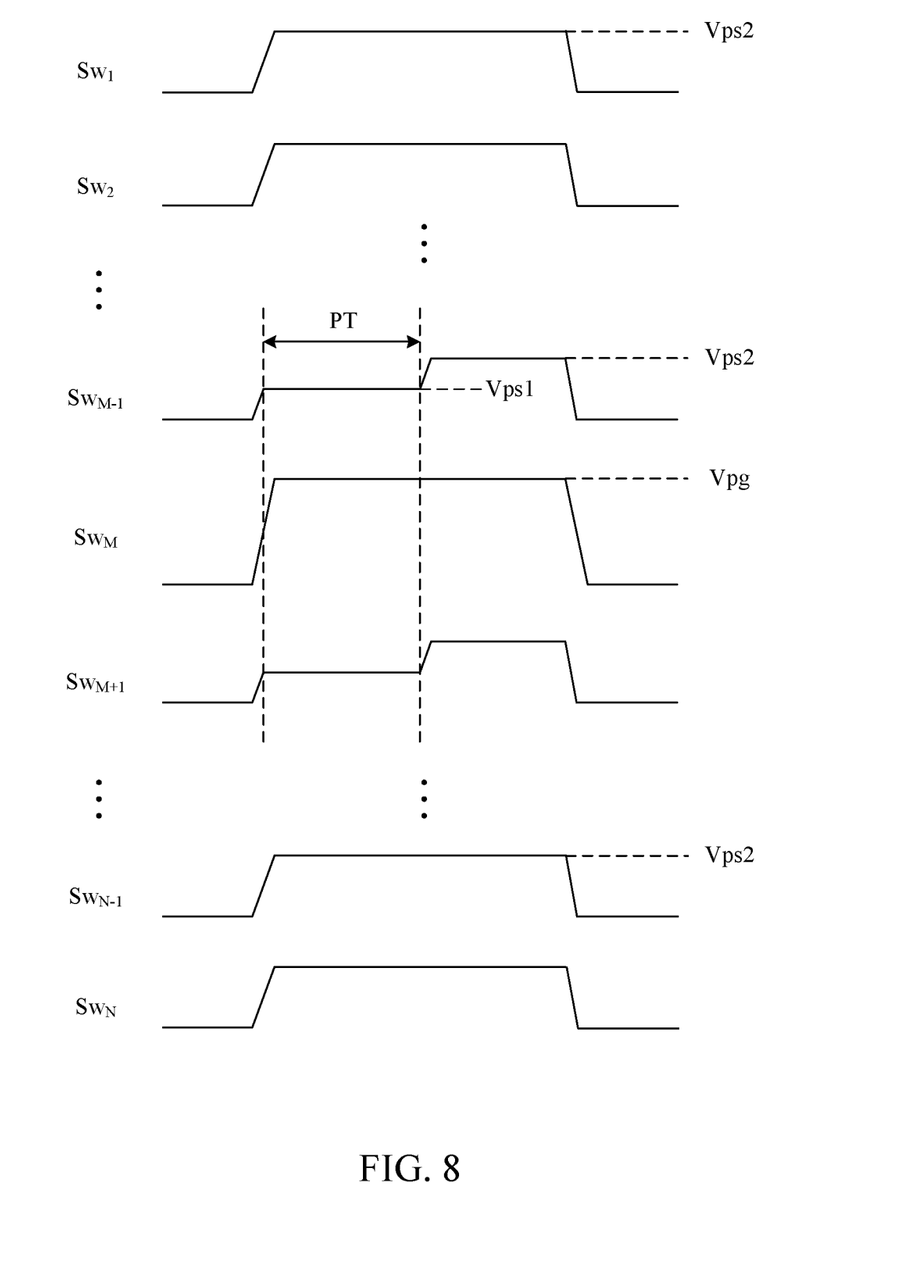
FIG. 8 illustrates schematic waveforms of the word line signals according to one embodiment of the present disclosure.

During operation S704, the row decoder 110 may select one of the word lines $140_1$-$140_N$ as a "selected word line" according to the received address, and configure the word line signal corresponding to the selected word line to be a "selected word line signal." Subsequently, the row decoder 110 switches the the selected word line signal from a predetermined voltage level (e.g., OV) to a program voltage level Vpg (e.g., 20V). As shown in FIG. 8, for example, the row decoder 110 selects the word line $140_M$ as the selected word line, configures the word line signal $Sw_M$ to be the selected word line signal, where M is a positive integer larger than or equal to 2. As a result, the voltage level of the word line signal $Sw_M$ is switched from 0 V to 20 V so that the non-volatile memory device 100 programs a memory cell coupled with the word line $140_M$.

Next, in operation S706, the row decoder 110 may select at least one of the word line signals $Sw_1$-$Sw_N$ as a "support word line signal", and switch the support word line signal from the predetermined voltage level (e.g., 0 V) to a first pass voltage level Vps1 (e.g., 5 V). As shown in FIG. 8, for example, the row decoder 110 selects the word lines signals $Sw_{M+1}$ and $Sw_{M+1}$ as the support signals, and switches the voltage levels of the word lines signals $Sw_{M-1}$ and $Sw_{M+1}$ from 0 V to 5 V.

In other words, the row decoder 110 may configure the two word lines (e.g., the word lines $140_{M-1}$ and $140_{M+1}$) next to the selected word line (e.g., the word line $140_M$) to be the support word lines to transmit the support word line signals. However, the present disclosure is not limited thereto, and the row decoder 110 may configure only one of the two word lines next to the selected word line to be the support word line.

Since a large voltage difference exists between the selected word line and the support word lines during operation S706, the selected word line rapidly charges the parasitic elements thereof (e.g., the capacitor elements 102 and 103 as shown in FIG. 1). As a result, the voltage level of the selected word line reaches the predetermined program voltage level Vpg in a shorter time.

In operation S708, when the selected word line signal is remained at the program voltage level Vpg, the row decoder 110 may switch the support word line signal from the first pass voltage level Vps1 to a second pass voltage level Vps2 (e.g., 10 V). As shown in FIG. 8, for example, when the word line signal $Sw_M$ is remained at 20 V, the word lines signals $Sw_{M-1}$ and $Sw_{M+1}$ are switched from 5 V to 10 V. Notably, the support word line signals are remained at the first pass voltage level Vps1 for a predetermined time PT before being switched to the second pass voltage level Vps2. In this embodiment, the predetermined time PT is at least 2 μs. In another embodiment, the predetermined time PT is at least 5 μs. In another embodiment, a difference between the first pass voltage level Vps1 and the second pass voltage level Vps2 is at least 2.8 V. In yet another embodiment, the difference between the first pass voltage level Vps1 and the second pass voltage level Vps2 is at least 5.8 V.

When the support word line signals are switched from the first pass voltage level Vps1 to the second pass voltage level Vps2, the voltage variations of the support word line signals transmit to the selected word line through the parasitic capacitor elements. Thus, the voltage level of the selected word line is raised rapidly. For example, the voltage variations of the word line signals $Sw_{M-1}$ and $Sw_{M+1}$ is transmitted to the word line $140_M$ through the capacitor elements 102 and 103. Since the parasitic capacitors 620a-620d had obtained enough charges in operation S706, the voltage level of the word line $140_M$ is raised rapidly in operation S708 because of the capacitive coupling.

Notably, in operations S702-S708, when the selected word line signal is remained at the program voltage level Vpg, among the word line signals $Sw_1$-$Sw_N$, the other word line signals different from the selected word line signal and the support word line signals may be switched by the row decoder 110 from the predetermined voltage level (e.g., 0V) to the second pass voltage level Vps2 (e.g., 10 V), and be maintained at the second pass voltage level Vps2 until the programming operation is finished. For example, as shown in FIG. 8, when the word line signal $Sw_M$ is remained at 20 V, the word line signals other than the word line signals $Sw_{M-1}$, $Sw_M$, and $Sw_{M+1}$ are switched from 0 V to 10 V, and are maintained at 10 V until the program operation is finished.

In one embodiment, the row decoder 110 not only configures the two word lines, which is next to the selected word line, to be the support lines, but also configures a predetermined number of other word lines to be the support word lines to transmit the support word line signals. Parasitic capacitor elements also exist between the word lines $140_1$-$140_N$ and the semiconductor layer (e.g., the semiconductor layer 310 of FIG. 3 and the semiconductor layer 510 of FIG. 5). Therefore, in operation S708 of this embodiment, even though some of the support word lines have longer distances to the selected word line, the voltage variations of those some of the support word lines will be transmitted to the selected word line through the semiconductor layer, which in turn raise the voltage level of the selected word line.

Figure 9:
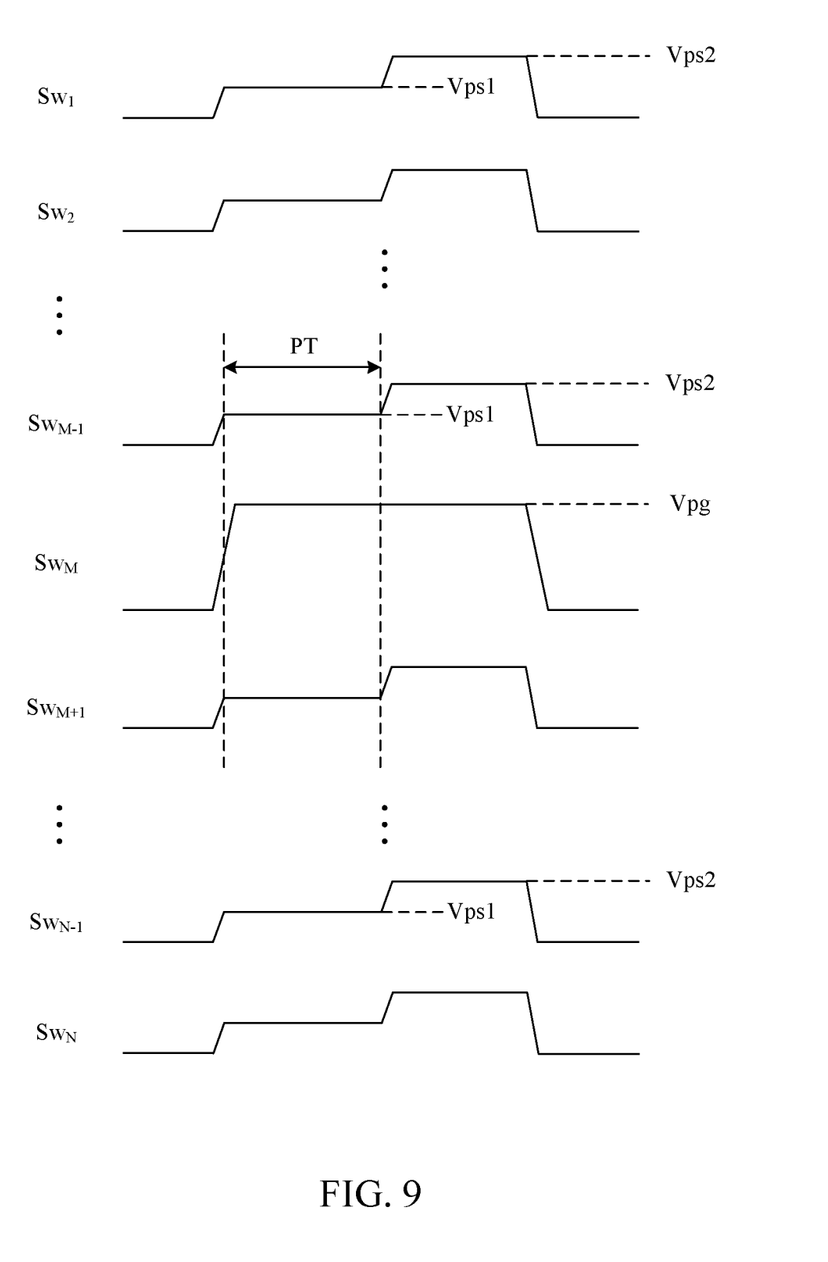
FIG. 9 illustrates schematic waveforms of the word line signals according to another embodiment of the present disclosure.

In another embodiment, the row decoder 110 configures all of the other word lines different from the selected word line to be the support word lines to transmit the support word line signal. That is, in operation S706 of this embodiment, all of the other word lines different from the selected word line are configured to transmit support word line signals having the first pass voltage level Vps1. Subsequently, in operation S708, the support word line signals of those all of the other word lines are switched from the first pass voltage level Vps1 to the second pass voltage level Vps2. As shown in FIG. 9, for example, in the situation that the word line $140_M$ is selected as the selected word line, all of the other word line signals different from the word line signal $Sw_M$ are the support word line signals. Therefore, all of the other word line signals different from the word line signal $Sw_M$ have the first pass voltage level Vps1 in operation S706, and are switched from the first pass voltage level Vps1 to the second pass voltage level Vps2 in operation S708.

Figure 10:
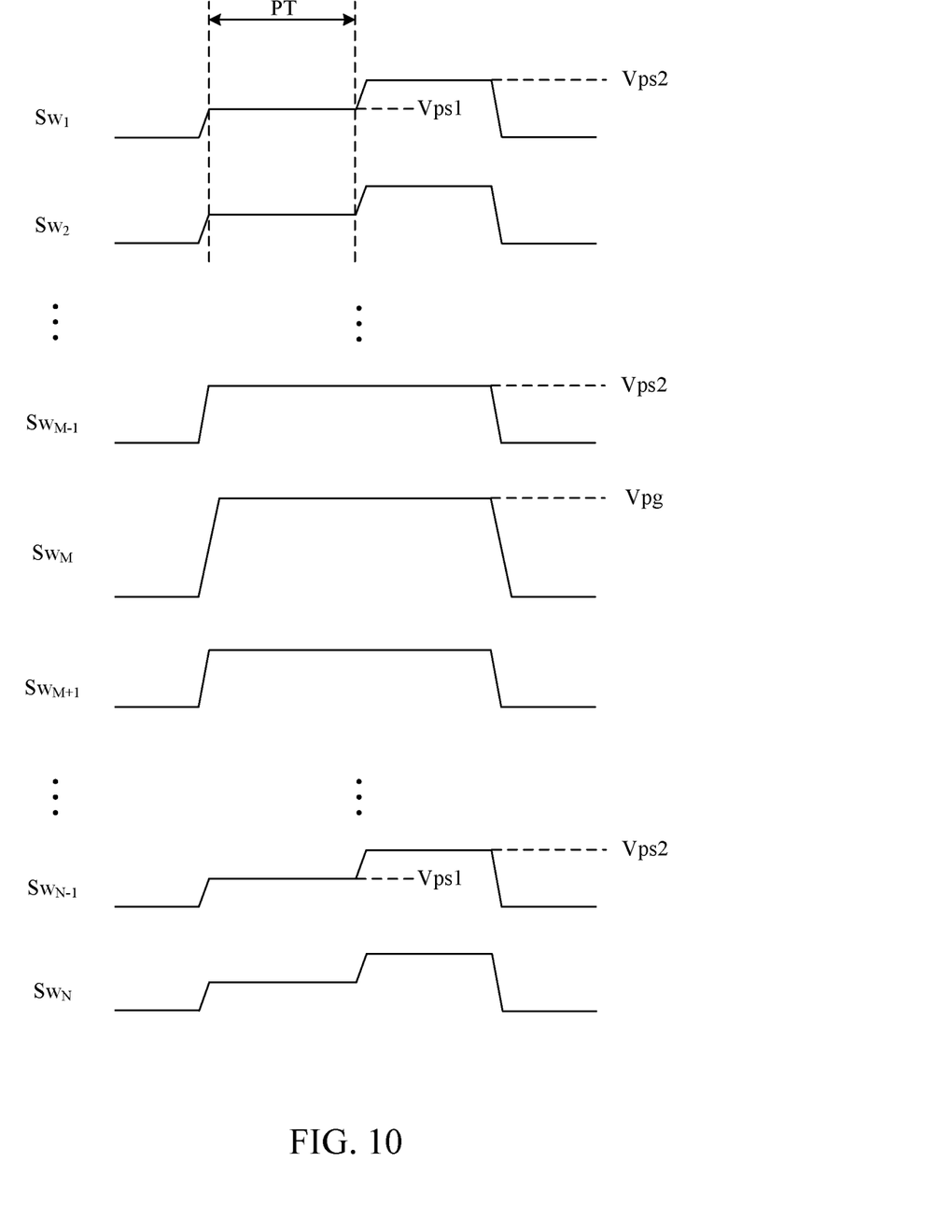
FIG. 10 illustrates schematic waveforms of the word line signals according to yet another embodiment of the present disclosure.

In yet another embodiment, the row decoder 110 configures the word lines not next to the selected word line to be the support word lines. As shown in FIG. 10, for example, in the situation that the word line $140_M$ is select as the selected word line, the word line $140_M$ and $140_{M+1}$ are not the support word lines, and the row decoder 110 selects the word lines other than the word lines $140_{M-1}$, $140_M$, and $140_{M+1}$ as the support word lines to transmit the support word line signals. Therefore, in the operations S702-S708, when the word line signal $Sw_M$ is remained at the program voltage level Vpg, the word line signal $Sw_{M-1}$ and $Sw_{M+1}$ are maintained at the second pass voltage level Vps2 until the program operation is finished, while the word line signals other than the word line signals $Sw_{M-1}$, $Sw_M$, and $Sw_M+_1$ have the first pass voltage level Vps1 in operation S706, and are switched from the first pass voltage level Vps1 to the second pass voltage level Vps2 in operation S708.

Figure 11:
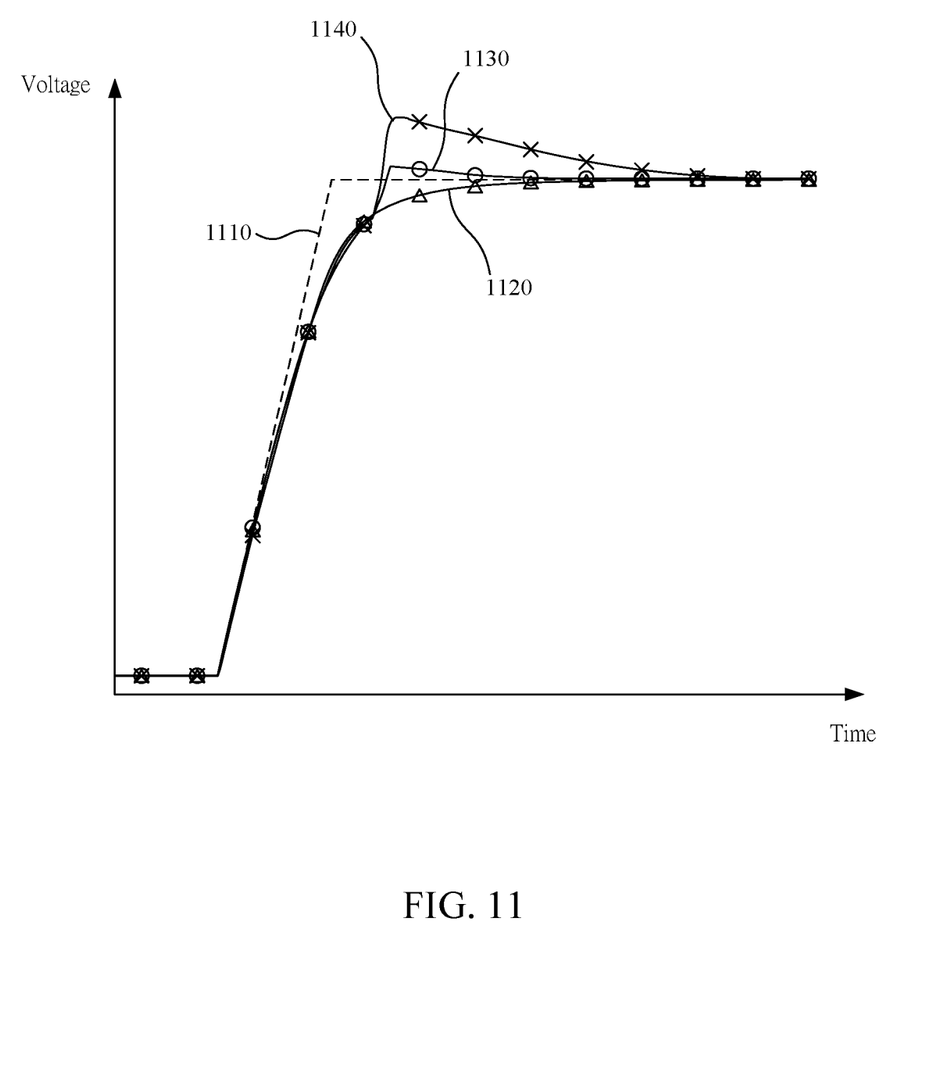
FIG. 11 illustrates schematic waveforms of the voltage level of the selected word line corresponding to various difference values between the first pass voltage level and the second pass voltage level.

FIG. 11 illustrates schematic waveforms of the voltage level of the selected word line corresponding to various difference values between the first pass voltage level Vps1 and the second pass voltage level Vps2. The curve 1110 refers to the ideal voltage waveform of the selected word line signal. The curve 1120 refers to a voltage waveform of the selected word line signal measured on the selected word line in the situation that the difference value between the first pass voltage level Vps1 and the second pass voltage level Vps2 is 0 V. The curve 1130 refers to a voltage waveform of the selected word line signal measured on the selected word line in the situation that the difference value between the first pass voltage level Vps1 and the second pass voltage level Vps2 is 2.8 V. The curve 1140 refers to a voltage waveform of the selected word line signal measured on the selected word line in the situation that the difference value between the first pass voltage level Vps1 and the second pass voltage level Vps2 is 5.8 V. As shown in FIG. 11, when the support word line signals are switched from the first pass voltage level Vps1 to the second pass voltage level Vps2, the selected word line signal generates an impulse because of the capacitive coupling. The peak value of the impulse is positive correlated to the difference between the first pass voltage level Vps1 and the second pass voltage level Vps2. Therefore, the program capability of the selected word line is also positive correlated to the difference between the first pass voltage level Vps1 and the second pass voltage level Vps2.

Figure 12:
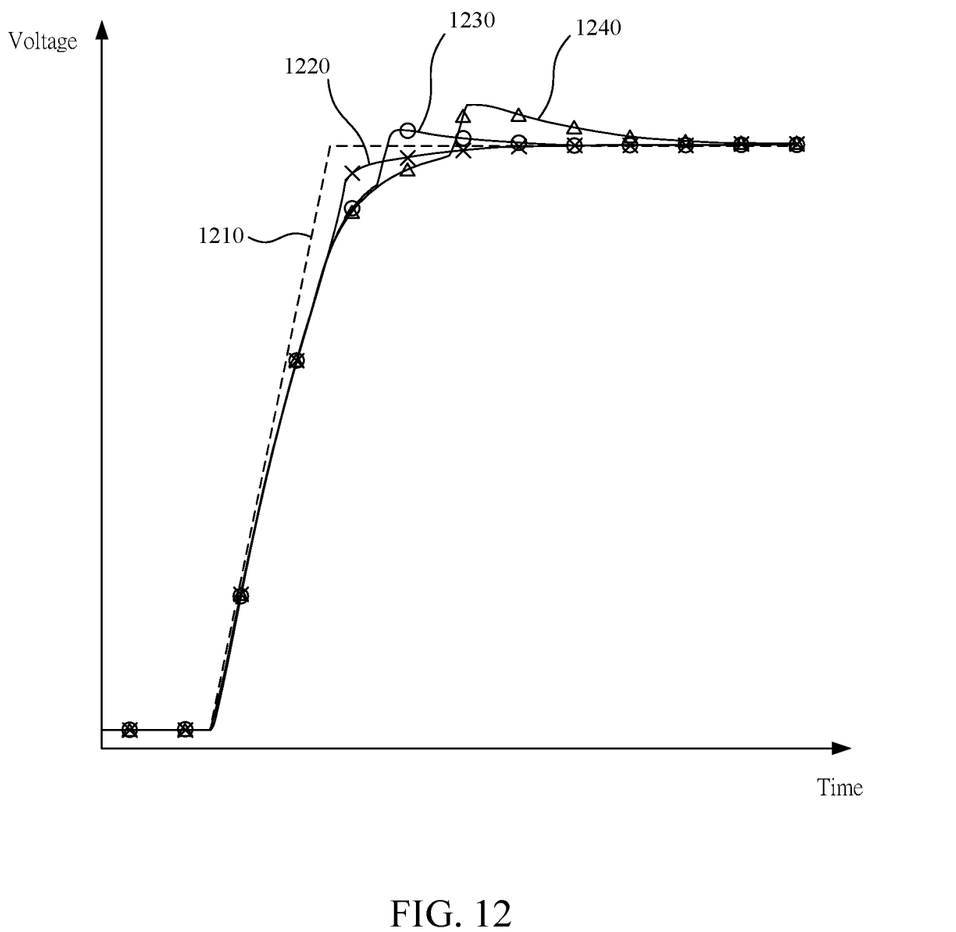
FIG. 12 illustrates schematic waveforms of the voltage level of the selected word line corresponding to various lengths of the predetermined time PT.

FIG. 12 illustrates schematic waveforms of the voltage level of the selected word line corresponding to various lengths of the predetermined time PT. The curve 1210 refers to the ideal voltage waveform of the selected word line signal. The curve 1220 refers to a voltage waveform of the selected word line signal measured on the selected word line in the situation that the predetermined time PT is 0 μs. The curve 1230 refers to a voltage waveform of the selected word line signal measured on the selected word line in the situation that the predetermined time PT is 2 μs. The curve 1230 refers to a voltage waveform of the selected word line signal measured on the selected word line in the situation that the predetermined time PT is 5 μs. As shown in FIG. 12, when the support word line signals are switched from the first pass voltage level Vps1 to the second pass voltage level Vps2, the peak value is positive correlated to the length of the predetermined time PT. Therefore, the program capability is also positive correlated to the length of the predetermined time PT.

Figure 13:
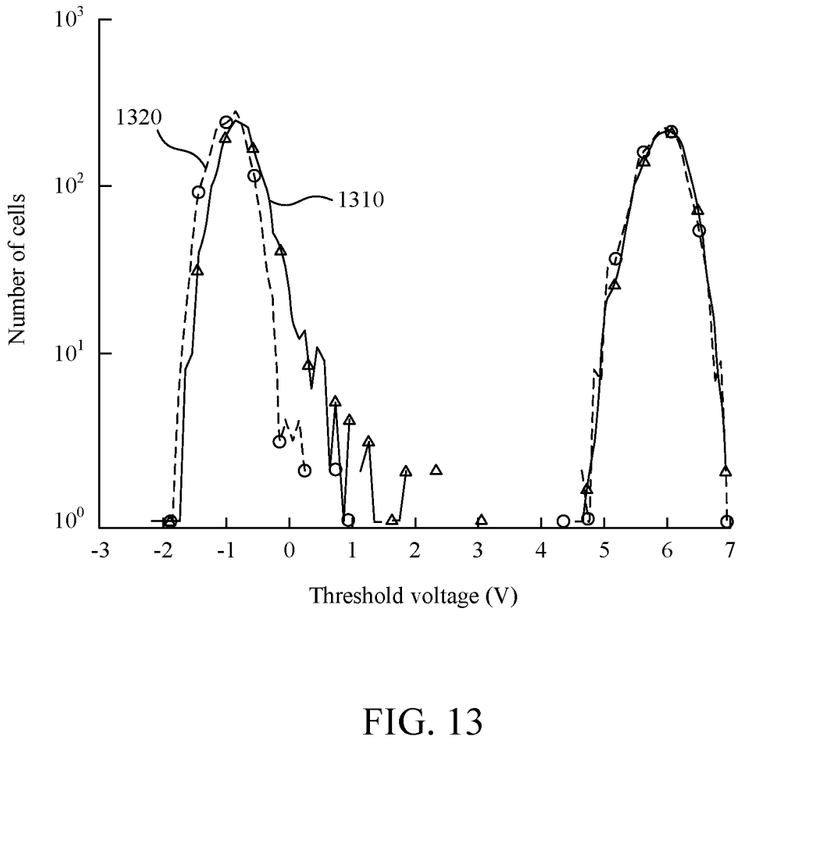
FIG. 13 is a schematic diagram illustrating the distribution profiles of the threshold voltages of the 3D memory array according to one embodiment of the present disclosure.

FIG. 13 is a schematic diagram illustrating the distribution profiles of the threshold voltages of the memory array according to one embodiment of the present disclosure. The curve 1310 refers to the distribution profile of the threshold voltage when the memory array is programed by using the conventional method. The curve 1320 refers to the distribution profile of the threshold voltage when the memory array is programed by using the non-volatile memory device driving method 700. As shown in FIG. 13, the non-volatile memory device driving method 700 is capable of mitigating the program disturb from which the memory array suffers.

As can be appreciated from the foregoing descriptions, since the non-volatile memory device driving method 700 can increase the program capability of the selected word line, the voltage range of the word line signals $Sw_1$-$Sw_N$ needs not to be increased to overcome the transfer delay caused by the parasitic capacitor elements, and the voltage range of the switching signals $Vpp_1$-$Vpp_N$ also needs not to be correspondingly increased to ensure that the word line signals $Sw_1$-$Sw_N$ with the enlarged voltage range can completely pass through. Therefore, the non-volatile memory device driving method 700 can reduce the design complexity of the non-volatile memory devices 100 and 600.

Please note that the execution order of the operations illustrated in FIG. 7 is merely an exemplary embodiment, rather than a restriction to the practical implementations. For example, the operations S704 and S706 may be conducted in parallel.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

In addition, the singular forms "a," "an," and "the" herein are intended to comprise the plural forms as well, unless the context clearly indicates otherwise.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A non-volatile memory device driving method, applicable to a non-volatile memory device comprising a row decoder and a memory array, comprising:
    utilizing the row decoder to transmit a plurality of word line signals to a plurality of word lines of the memory array;
    according to an address, utilizing the row decoder to switch a selected word line signal of the plurality of word line signals from a predetermined voltage level to a program voltage level, wherein the selected word line signal is transmitted via a selected word line of the plurality of word lines to program a memory cell coupled with the selected word line;
    utilizing the row decoder to switch at least one support word line signal of the plurality of word line signals from the predetermined voltage level to a first pass voltage level, wherein the at least one support word line signal is transmitted via at least one support word line of the plurality of word lines, and the at least one support word line is different from the selected word line; and
    when the selected word line signal is remained at the program voltage level, utilizing the row decoder to switch the at least one support word line signal from the first pass voltage level to a second pass voltage level, wherein the second pass voltage level is higher than the first pass voltage level.

2. The non-volatile memory device driving method of claim 1, wherein when the selected word line signal is remained at the program voltage level, other word line signals of the plurality of word line signals are remained at the second pass voltage level, wherein the other word line signals are different from the selected word line signal and the at least one support word line signal.

3. The non-volatile memory device driving method of claim 1, wherein when the at least one support word line signal is switched from the first pass voltage level to the second pass voltage level, the selected word line signal generates an impulse.

4. The non-volatile memory device driving method of claim 1, wherein the selected word line is an M-th word line of the plurality of word lines, and M is a positive integer larger than or equal to 2,
    wherein the at least one support signal comprises a first support word line signal and a second support word line signal, the first support word line signal and the second support word line signal are transmitted via an (M−1)-th word line and an (M+1)-th word line of the plurality of word lines, respectively.

5. The non-volatile memory device driving method of claim 1, wherein the at least one support word line comprises all of other word lines of the plurality of word lines, and the all of other word lines are different from the selected word line.

6. The non-volatile memory device driving method of claim 1, wherein the at least one support word line is arranged to be not next to the selected word line.

7. The non-volatile memory device driving method of claim 1, wherein a difference between the first pass voltage level and the second pass voltage level is at least 2.8 V.

8. The non-volatile memory device driving method of claim 7, wherein the difference between the first pass voltage level and the second pass voltage level is at least 5.8V.

9. The non-volatile memory device driving method of claim 1, wherein the at least one support word line signal is remained at the first pass voltage level for at least 2 microseconds.

10. The non-volatile memory device driving method of claim 9, wherein the at least one support word line signal is remained at the first pass voltage level for at least 5 microseconds.

11. A non-volatile memory device, comprising:
    a memory array, comprising a plurality of word lines; and
    a row decoder, configured to receive an address, and to transmit a plurality of word line signals to the plurality of word lines;
    wherein the row decoder is further configured to switch a selected word line signal of the plurality of word line signals from a predetermined voltage level to a program voltage level according to the address, and to switch at least one support word line signal of the plurality of word line signals from the predetermined voltage level to a first pass voltage level;
    wherein the selected word line signal is transmitted via a selected word line of the plurality of word lines to program a memory cell coupled with the selected word line, the at least one support word line signal is transmitted via at least one support word line of the plurality of word lines, and the at least one support word line is different from the selected word line;
    wherein when the selected word line signal is remained at the program voltage level, the row decoder switches the at least one support word line signal from the first pass voltage level to a second pass voltage level, and the second pass voltage level is higher than the first pass voltage level.

12. The non-volatile memory device of claim 11, wherein when the selected word line signal is remained at the program voltage level, other word line signals of the plurality of word line signals are remained at the second pass voltage level, and the other word line signals are different from the selected word line signal and the at least one support word line signal.

13. The non-volatile memory device of claim 11, wherein when the at least one support word line signal is switched from the first pass voltage level to the second pass voltage level, the selected word line signal generates an impulse.

14. The non-volatile memory device of claim 11, wherein the selected word line is an M-th word line of the plurality of word lines, and M is a positive integer larger than or equal to 2,
wherein the at least one support signal comprises a first support word line signal and a second support word line signal, and the first support word line signal and the second support word line signal are transmitted via an (M−1)-th word line and an (M+1)-th word line of the plurality of word lines, respectively.

15. The non-volatile memory device of claim 11, wherein the at least one support word line comprises all of other word lines of the plurality of word lines, and the all of other word lines are different from the selected word line.

16. The non-volatile memory device of claim 11, wherein the at least one support word line is arranged to be not next to the selected word line.

17. The non-volatile memory device of claim 11, wherein a difference between the first pass voltage level and the second pass voltage level is at least 2.8 V.

18. The non-volatile memory device of claim 17, wherein the difference between the first pass voltage level and the second pass voltage level is at least 5.8 V.

19. The non-volatile memory device of claim 11, wherein the at least one support word line signal is remained at the first pass voltage level for at least 2 microseconds.

20. The non-volatile memory device of claim 19, wherein the at least one support word line signal is remained at the first pass voltage level for at least 5 microseconds.

* * * * *